(12) United States Patent
Lubbers

(10) Patent No.: US 6,788,147 B1
(45) Date of Patent: Sep. 7, 2004

(54) OPERATIONAL AMPLIFIER WITH CLASS-AB+B OUTPUT STAGE

(75) Inventor: Alexander Petrus Gerardus Lubbers, Lochem (NL)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/288,162

(22) Filed: Nov. 5, 2002

(51) Int. Cl.[7] ................................................ H03F 3/18

(52) U.S. Cl. ...................................... 330/264; 330/269

(58) Field of Search ................................ 330/264, 269, 330/277

(56) References Cited

U.S. PATENT DOCUMENTS

| | | | |
|---|---|---|---|
| 5,485,123 A | * | 1/1996 | Kiehl .......................... 330/264 |
| 6,121,839 A | * | 9/2000 | Giacomini ................... 330/264 |
| 6,369,653 B1 | * | 4/2002 | Kappes ....................... 330/264 |

* cited by examiner

Primary Examiner—Khanh Van Nguyen

(57) ABSTRACT

An amplifier comprising: 1) a class-AB push-pull stage comprising a first P-channel output transistor and a first N-channel output transistor for driving an output load; and 2) a class-B current booster stage coupled in parallel with the class-AB push-pull stage comprising a second P-channel output transistor and a second N-channel output transistor for driving the output load. The small class-AB transistors have a minimum quiescent transconductance. The class-B current booster transistors are inactive in the quiescent state, but deliver large currents for output voltages approaching the power supply rails.

20 Claims, 2 Drawing Sheets

OPERATIONAL AMPLIFIER WITH CLASS-AB+B OUTPUT STAGE

TECHNICAL FIELD OF THE INVENTION

The present invention is generally directed to operational amplifiers, and more specifically, to a low-supply voltage operational amplifier that drives large currents with rail-to-rail output voltages.

BACKGROUND OF THE INVENTION

Increasingly, electronic devices are designed to operate from ever smaller power supply voltages. Smaller supply voltages are designed to minimize leakage currents and other undesirable effects that increase at smaller transistor sizes (e.g., 0.18 microns). Smaller supply voltages also save power, which is an especially important consideration in portable devices that operate from a battery. For example, current cellular telephones and other portable applications operate from a +1.8 volt power supply rail.

However, problems are encountered as power supply voltage levels become ever smaller. In applications where a given amount of power is required, the trend toward smaller supply voltages means that the current requirement must be increased to offset the reduced power supply voltage. For example, in a cellular telephone, a given amount of power is required to drive the speaker to an audible level. To maintain this power level, the current driving the speaker must increase as the output voltage decreases. The impedance of the speaker becomes smaller with the supply voltage in order to maintain the output power due to a larger current.

But difficulties are encountered when trying to combine a rail-to-rail output voltage range (0 to 1.8 volts) with a large output current (e.g., 60 mA). In order to drive a large current with a small drain-source voltage, V(ds), as is the case with the output transistors of a speaker driver, large W/L (channel width (W) to channel length (L) ratio) values are needed. As a result, the quiescent gate-source voltages V(gs) of these transistors tend to become very small in order to keep the quiescent current, I(q), acceptably small.

However, if a class-AB push-pull operational amplifier (op-amp) drives the speaker, the V(gs) of the push-pull transistors of the output stage should be at least larger than one saturation voltage V(dssat) of the output transistors of the previous stage, in order to maintain their high output resistance and thus the voltage gain of the first stage. Thus, large output transistors become very difficult (or even impossible) to bias in a conventional class-AB operational amplifier (op-amp) with an acceptably small quiescent current, I(q).

Therefore there is a need in the art for improved operational amplifier that are able to operate from small power supply voltage levels while still driving large output currents. In particular, there is a need for an op-amp that operates from a +1.8 volt power supply, that drives a large amount of current, and that has a small quiescent current.

SUMMARY OF THE INVENTION

The present invention provides an improved operational amplifier that solves the above-described problem of using standard class-AB power amplifiers at low supply voltages (e.g., +1.8 volts). The present invention comprises a class-AB stage followed by a class B current booster stage. The present invention divides the output transistors into relatively large class-B output drivers in parallel with relatively small class-AB transistors. The small class-AB transistors have a minimum quiescent transconductance, whereas the class-B current booster transistors are inactive in the quiescent state and only deliver large currents for output voltages approaching the power supply rails.

The class-B current booster stage has minimum impact on the class-AB amplifier stage and can be adjusted independently whenever larger currents are needed in future applications. Furthermore, the transistors of the class-B current booster do not have to match in any way with other transistors and are therefore easy to handle in layout.

To address the above-discussed deficiencies of the prior art, it is a primary object of the present invention to provide an improved operational amplifier. According to an advantageous embodiment of the present invention, the operational amplifier comprises: 1) a class-AB push-pull stage comprising a first P-channel output transistor and a first N-channel output transistor for driving an output load; and 2) a class-B current booster stage coupled in parallel with the class-AB push-pull stage comprising a second P-channel output transistor and a second N-channel output transistor for driving the output load.

According to one embodiment of the present invention, the first P-channel output transistor and the first N-channel output transistor have a minimum quiescent transconductance level.

According to another embodiment of the present invention, the second P-channel output transistor and the second N-channel output transistor are biased so that the second P-channel output transistor and the second N-channel output transistor are inactive in the quiescent state.

According to still another embodiment of the present invention, the second P-channel output transistor turns on as an output voltage of the operational amplifier increases towards a positive power supply fail.

According to yet another embodiment of the present invention, the second P-channel output transistor is capable of driving a larger current into the output load than the first P-channel output transistor.

According to a further embodiment of the present invention, the second P-channel output transistor is coupled to the first P-channel output transistor by a coupling P-channel transistor, wherein a gate of the coupling P-channel output transistor is coupled to a gate of the first P-channel output transistor and a source of the coupling P-channel output transistor is coupled to a gate of the second P-channel output transistor.

According to a still further embodiment of the present invention, the second N-channel output transistor turns on as an output voltage of the operational amplifier decreases towards a negative power supply fail.

According to a yet further embodiment of the present invention, the second N-channel output transistor is capable of sinking a larger current from the output load than the first N-channel output transistor.

In one embodiment of the present invention, the second N-channel output transistor is coupled to the first N-channel output transistor by a coupling N-channel transistor, wherein a gate of the coupling N-channel output transistor is coupled to a gate of the first N-channel output transistor and a source of the coupling N-channel output transistor is coupled to a gate of the second N-channel output transistor.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

Figure 1:
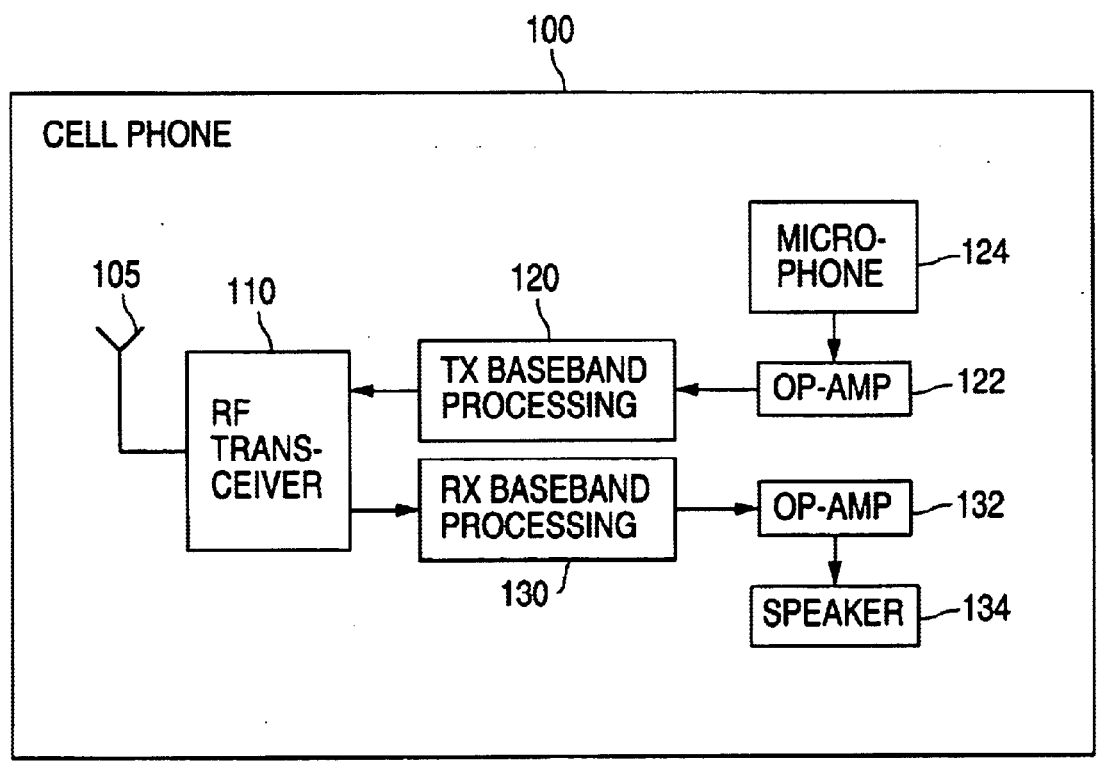
FIG. 1 illustrates a cellular telephone containing an operational amplifier according to the principles of the present invention.
Figure 2:
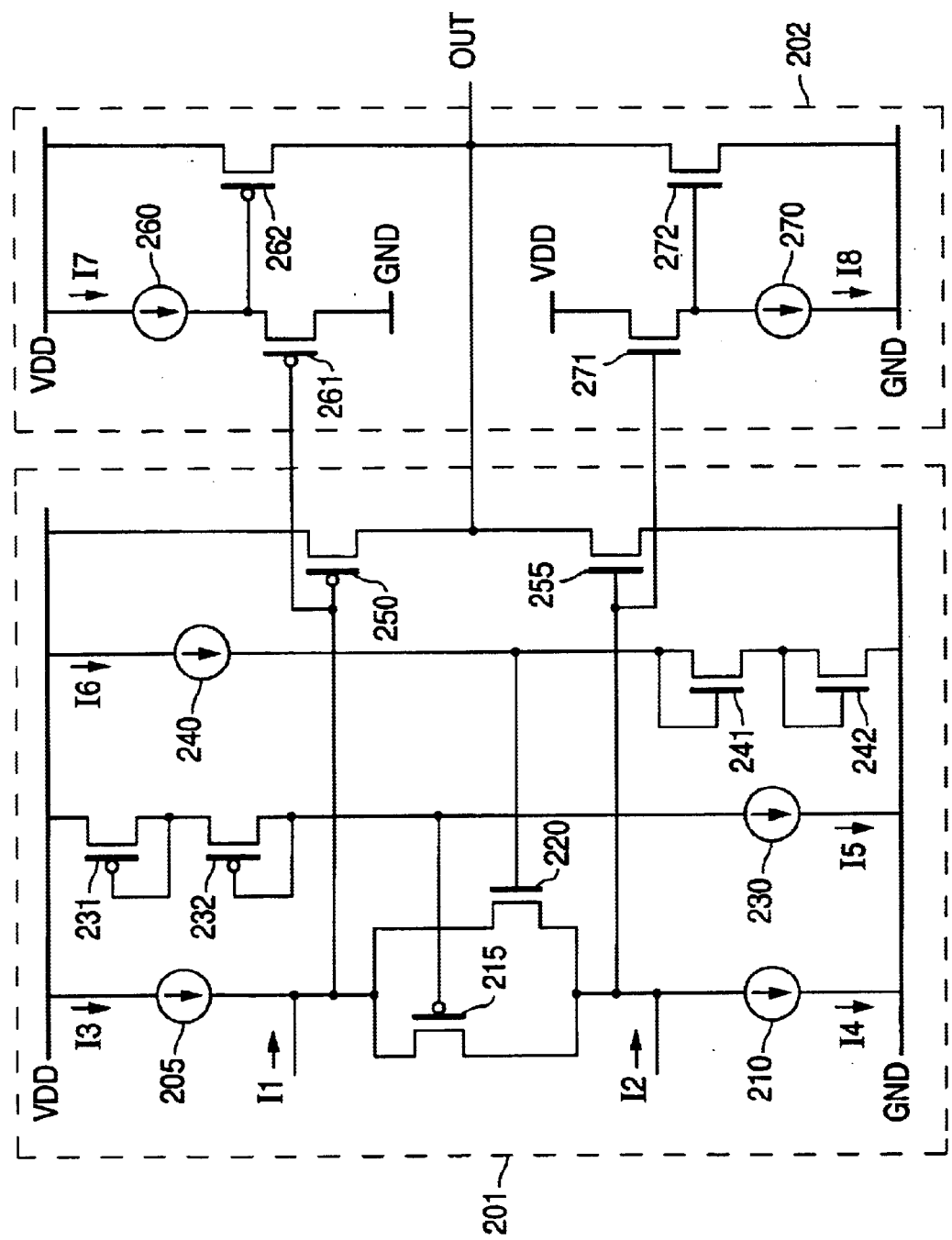
FIG. 2 illustrates the output stages of an operational amplifier according to the principles of the present invention.

FIGS. 1 and 2, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged operational amplifier.

FIG. 1 illustrates cellular telephone 100, which contains operational amplifiers according to the principles of the present invention. Cellular telephone 100 comprises antenna 105, radio frequency (RF) transceiver 110, transmit (TX) baseband processing block 120, operational amplifier (op-amp) 122, and microphone 124. Cellular telephone 100 also comprises receive (RX) baseband processing block 130, operational amplifier (op-amp) 132, and speaker 134.

In the receive path, RF transceiver 110 receives from antenna 105 an incoming (i.e., forward channel) RF signal and performs down-conversion and demodulation to produce a forward channel baseband signal. Receive baseband processing block 130 performs additional processing functions on the forward channel baseband signal, such as automatic gain control, error correction, de-interleaving, analog to digital conversion, and the like. At least a portion of the forward channel baseband signal is converted to an analog audio signal (i.e., voice signal) that is transferred to operational amplifier 132. Operational amplifier 132 amplifies the analog audio signal to a suitable power level to driver speaker 134.

In the transmit path, microphone 124 converts the voice of the user of cell phone 100 to an analog signal that is amplified by operational amplifier 122. Transmit baseband processing block 130 receives the amplified audio signal and performs additional processing functions, such as automatic gain control, error encoding, interleaving, digital-to-analog conversion, and the like. In essence, transmit baseband processing block 130 performs the opposite of many of the functions performed by receive baseband processing block 120. The output of transmit baseband processing block 130 is the reverse channel baseband signal. RF transceiver 110 performs modulation and up-conversion of the reverse channel baseband signal to produce an outgoing RF signal that is transmitted by antenna 105.

According to an exemplary embodiment of the present invention, many of the circuits in cell phone 100 operate from relatively small supply voltages. For example, operational amplifier 122 and operational amplifier 132 may operate from a +1.8 volt power supply rail. To avoid the above-described problems associated with driving large current loads from a small power supply rail, operational amplifiers 122 and 132, as well as other circuits in cell phone 100 may implement class-AB+B current booster output stages according to the principles of the present invention.

FIG. 2 illustrates selected portions of output stages of exemplary operational amplifier 132 according to one embodiment of the present invention. The output stages of operational amplifier 132 comprise class-AB stage 201 and class-B stage 202. Class-B stage 202 is a conventional push-pull stage connected in parallel with another conventional push-pull stage in class-AB stage 201. An advantage of the class-AB+B approach is that two design parameters, namely: 1) minimum output transconductance (for stability) and thus minimum quiescent current, I(q), and 2) a large current drive capability, become independent and are even physically separated in the class-AB stage and the class-B stage, respectively.

Class-AB stage 201 has a floating class-AB input control circuit comprising current source 205, current source 210, P-channel transistor 215, N-channel transistor 220. According to an exemplary embodiment of the present invention, current source 205 may comprise a properly biased P-channel transistor that injects current I3 into P-channel transistor 215 and N-channel transistor 220. Also, current source 210 comprises a properly biased N-channel transistor that draws current I4 from P-channel transistor 215 and N-channel transistor 220, where I3=I4. It is noted that V(ds) of current source 205 is equal to V(gs) of P-channel transistor 250. It also is noted that V(ds) of current source 210 is equal to V(gs) of N-channel transistor 255. Currents I1 and I2 are the input signals received from the preceding amplifier stage of operational amplifier 132.

Class-AB stage 201 comprises a first biasing circuit, comprising current source 230, diode-connected P-channel transistor 231, and diode-connected P-channel transistor 232. When bias current IS flows through transistors 231 and 232, the gate of P-channel transistor 215 is 2V(gs) (i.e., two gate-to-source voltage drops) below VDD. Class-AB stage also comprises a second biasing circuit, comprising current source 240, diode-connected N-channel transistor 241, and diode-connected N-channel transistor 242. When bias current I6 flows through transistors 241 and 242, the gate of N-channel transistor 220 is 2V(gs) (i.e., two gate-to-source voltage drops) above ground (GND). Finally, class-AB stage 201 comprises two output transistors, namely P-channel transistor 250 and N-channel transistor 255.

Class-B stage 202 comprises a first level shifting circuit, comprising current source 260 and P-channel transistor 261, and a second level shifting circuit, comprising current source 270 and N-channel transistor 271. Finally, class-B stage 202 comprises P-channel transistor 262 and N-channel transistor 272.

Given a maximum load capacitance, class-AB stage 201 can be optimized for the minimum (quiescent) needed transconductance. However, the extra capacitance of large transistors 262 and 272 of class-B stage 202 must be taken into account in the design of class-AB stage 202. The quiescent transconductance results in a quiescent current, I(q), in P-channel transistor 250 and N-channel transistor 255 constrained by a large enough gate-to-source voltage, V(gs), to keep the transistor that forms current source 205 and the transistor that forms current source 210 in saturation at all times. The resulting class-AB stage 201 cannot deliver enough current to drive speaker 134 by itself. However, is the current booster of class-B stage 202 provides the necessary load current instead. Hence, the dimensions of P-channel transistor 262 and N-channel transistor 272 may be based on the maximum current that must be deliver at a minimum drain-to-source voltage, V(ds).

Advantageously, P-channel transistor 262 and N-channel transistor 272 do not conduct in the quiescent state because the quiescent V(gs) levels of both P-channel transistor 262 and N-channel transistor 272 are decreased below the respective threshold voltages by means of level shifters (i.e., source followers). When bias current I7 flows into P-channel transistor 261, the gate voltage of P-channel transistor 262 is higher than the gate voltage of P-channel transistor 250 by the V(gs) value of P-channel transistor 261. Similarly, when bias current I8 flows through N-channel transistor 271, the gate voltage of N-channel transistor 272 is lower than the gate voltage of N-channel transistor 25S by the V(gs) value of N-channel transistor 271. This means that the added current booster in class-B stage 202 has no impact on the total quiescent current of operational amplifier 132.

At a certain output level one of P-channel transistor 262 or N-channel transistor 272 starts to conduct, eventually taking over the main current from P-channel transistor 250 and N-channel transistor 255 towards the maximum (VDD) output level or the minimum level (GND). Advantageously, the level shifters (i.e., P-channel transistor 261 and N-channel transistor 271 are source followers acting as buffers. Thus, the gate-to-source capacitance, C(gs), of the large output drivers, P-channel transistor 262 and N-channel transistor 272, do not load the first stage.

In class-AB stages, device matching is needed in order to set a specific quiescent current. This is not the case with the class-B current booster, including the level shifters and bias current sources. This provides certain advantages, including that the current booster does not need to be located close to the rest of the circuitry in amplifier 132. Instead, the current booster circuitry may be located elsewhere with an arbitrary orientation. In particular, P-channel transistor 262 and N-channel transistor 272 (with their high currents and large power dissipation) may be located in strategically advantageous positions (e.g., the between the pads) with respect to thermal issues, noise, power and minimum series resistance of the wires.

Although the present invention has been described with an exemplary embodiment, various changes and modifications may be suggested to one skilled in the art. It is intended that the present invention encompass such changes and modifications as fall within the scope of the appended claims.

What is claimed is:

1. An operational amplifier comprising:
   a class-AB push-pull stage comprising a first P-channel output transistor and a first N-channel output transistor for driving an output load; and
   a class-B current booster stage coupled in parallel with said class-AB push-pull stage comprising a second P-channel output transistor and a second N-channel output transistor for driving said output load.

2. The operational amplifier as set forth in claim 1 wherein said first P-channel output transistor and said first N-channel output transistor have a minimum quiescent transconductance level.

3. The operational amplifier as set forth in claim 2 wherein said second P-channel output transistor and said second N-channel output transistor are biased so that said second P-channel output transistor and said second N-channel output transistor are inactive in the quiescent state.

4. The operational amplifier as set forth in claim 3 wherein said second P-channel output transistor turns on as an output voltage of said operational amplifier increases towards a positive power supply fail.

5. The operational amplifier as set forth in claim 4 wherein said second P-channel output transistor is capable of driving a larger current into said output load than said first P-channel output transistor.

6. The operational amplifier as set forth in claim 5 wherein said second P-channel output transistor is coupled to said first P-channel output transistor by a coupling P-channel transistor, wherein a gate of said coupling P-channel output transistor is coupled to a gate of said first P-channel output transistor and a source of said coupling P-channel output transistor is coupled to a gate of said second P-channel output transistor.

7. The operational amplifier as set forth in claim 3 wherein said second N-channel output transistor turns on as an output voltage of said operational amplifier decreases towards a negative power supply fail.

8. The operational amplifier as set forth in claim 7 wherein said second N-channel output transistor is capable of sinking a larger current from said output load than said first N-channel output transistor.

9. The operational amplifier as set forth in claim 8 wherein said second N-channel output transistor is coupled to said first N-channel output transistor by a coupling N-channel transistor, wherein a gate of said coupling N-channel output transistor is coupled to a gate of said first N-channel output transistor and a source of said coupling N-channel output transistor is coupled to a gate of said second N-channel output transistor.

10. A cellular telephone comprising:
    a radio-frequency (RF) transceiver for transmitting an outgoing RF signal and receiving an incoming RF signal;
    baseband processing circuitry for processing a forward channel baseband signal received from said RF transceiver and processing a reverse channel baseband signal sent to said RF transceiver; and
    an operational amplifier capable of amplifying at least one of an analog signal and a digital signal in said cellular telephone, said operational amplifier comprising:
    a class-AB push-pull stage comprising a first P-channel output transistor and a first N-channel output transistor for driving an output load; and
    a class-B current booster stage coupled in parallel with said class-AB push-pull stage comprising a second P-channel output transistor and a second N-channel output transistor for driving said output load.

11. The cellular telephone as set forth in claim 10 wherein said first P-channel output transistor and said first N-channel output transistor have a minimum quiescent transconductance level.

12. The cellular telephone as set forth in claim 11 wherein said second P-channel output transistor and said second N-channel output transistor are biased so that said second P-Channel output transistor and said second N-channel output transistor are inactive in the quiescent state.

13. The cellular telephone as set forth in claim 12 wherein said second P-channel output transistor turns on as an output voltage of said operational amplifier increases towards a positive power supply fail.

14. The cellular telephone as set forth in claim 13 wherein said second P-channel output transistor is capable of driving a larger current into said output load than said first P-channel output transistor.

15. The cellular telephone as set forth in claim 14 wherein said second P-channel output transistor is coupled to said first P-channel output transistor by a coupling P-channel transistor, wherein a gate of said coupling P-channel output transistor is coupled to a gate of said first P-channel output transistor and a source of said coupling P-channel output transistor is coupled to a gate of said second P-channel output transistor.

16. The cellular telephone as set forth in claim 12 wherein said second N-channel output transistor turns on as an output voltage of said operational amplifier decreases towards a negative power supply fail.

17. The cellular telephone as set forth in claim 16 wherein said second N-channel output transistor is capable of sinking a larger current from said output load than said first N-channel output transistor.

18. The cellular telephone as set forth in claim 17 wherein said second N-channel output transistor is coupled to said first N-channel output transistor by a coupling N-channel transistor, wherein a gate of said coupling N-channel output transistor is coupled to a gate of said first N-channel output transistor and a source of said coupling N-channel output transistor is coupled to a gate of said second N-channel output transistor.

19. An operational amplifier having an output stage comprising:
   a first P-channel transistor having a drain suitable for coupling to an output load and a source coupled to a VDD power supply;
   a second P-channel transistor having a drain suitable for coupling to said output load and a source coupled to said VDD power supply;
   a third P-channel transistor having a gate coupled to a gate of said first P-channel transistor and a source coupled to a gate of said second P-channel transistor;
   a first N-channel transistor having a drain suitable for coupling to said output load and a source coupled to ground;
   a second N-channel transistor having a drain suitable for coupling to said output load and a source coupled to ground; and
   a third N-channel transistor having a gate coupled to a gate of said first N-channel transistor and a source coupled to a gate of said second N-channel transistor.

20. The operational amplifier as set forth in claim 19 wherein said first P-channel output transistor and said first N-channel output transistor have a minimum quiescent transconductance and said second P-channel output transistor and said second N-channel output transistor are biased so that said second P-channel output transistor and said second N-channel output transistor are inactive in the quiescent state.

* * * * *

UNITED STATES PATENT AND TRADEMARK OFFICE
CERTIFICATE OF CORRECTION

PATENT NO. : 6,788,147 B1 Page 1 of 1
DATED : September 7, 2004
INVENTOR(S) : Alexander Petrus Gerardus Lubbers It is certified that error appears in the above-identified patent and that said Letters Patent is hereby corrected as shown below:

Column 4,
Line 55, "IS" and insert -- I5 --; and

Column 5,
Line 34, delete "25S" and insert -- 255 --.

Signed and Sealed this

Sixth Day of September, 2005

JON W. DUDAS
*Director of the United States Patent and Trademark Office*